US012812775B2

(12) United States Patent
Hyodo

(10) Patent No.: US 12,812,775 B2
(45) Date of Patent: Nov. 24, 2026

(54) STRETCHABLE DEVICE

(71) Applicant: Magnolia White Corporation, Tokyo (JP)

(72) Inventor: Yosuke Hyodo, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 320 days.

(21) Appl. No.: 18/757,082

(22) Filed: Jun. 27, 2024

(65) Prior Publication Data

US 2025/0016925 A1 Jan. 9, 2025

(30) Foreign Application Priority Data

Jul. 3, 2023 (JP) ................................ 2023-109385

(51) Int. Cl.

*H05K 1/02* (2006.01)
*G01L 1/22* (2006.01)
*H05K 1/14* (2006.01)

(52) U.S. Cl.

CPC .......... *H05K 1/0283* (2013.01); *G01L 1/2262* (2013.01); *G01L 1/2293* (2013.01); *H05K 1/14* (2013.01)

(58) Field of Classification Search

CPC ................... H05K 1/14; H05K 1/0283; H05K 2201/09263; H05K 1/02; G01L 1/2293; G01L 1/2262

See application file for complete search history.

(56) References Cited

U.S. PATENT DOCUMENTS 9,246,078 B2 * 1/2016 Reed ...................... H10N 30/03
10,840,536 B2 * 11/2020 Rogers ................... H01G 11/78
2021/0234108 A1 7/2021 Sano
2023/0059822 A1 2/2023 Hanada et al.
2024/0147611 A1 * 5/2024 Sano ........................ H05K 1/02

FOREIGN PATENT DOCUMENTS

JP 2021-118273 A 8/2021
JP 2023-028988 A 3/2023

* cited by examiner

*Primary Examiner* — Steven T Sawyer
(74) *Attorney, Agent, or Firm* — K&L Gates LLP

(57) ABSTRACT

According to an aspect, a stretchable device includes a first stretchable resin, a resin base member, an array layer, and a second stretchable resin stacked in the order as listed. The resin base member includes: a plurality of bodies; and a plurality of hinges that couple the bodies. The array layer includes: a plurality of thin-film transistors disposed at the bodies; and a plurality of strain gauges disposed at the hinges. The strain gauges each include a semiconductor strain gauge made of semiconductor material at a part in a longitudinal direction. An impurity concentration of the semiconductor strain gauge is higher than an impurity concentration of the thin-film transistor.

15 Claims, 9 Drawing Sheets

STRETCHABLE DEVICE

CROSS-REFERENCE TO RELATED APPLICATION

This application claims the benefit of priority from Japanese Patent Application No. 2023-109385 filed on Jul. 3, 2023, the entire contents of which are incorporated herein by reference.

BACKGROUND

1. Technical Field

What is disclosed herein relates to a stretchable device.

2. Description of the Related Art

Stretchable devices have excellent elasticity and flexibility. Such stretchable devices include an array layer, a resin base member provided with the array layer, and a pair of stretchable resins that sandwich the array layer and the resin base member. The resin base member includes bodies arrayed in a matrix (row-column configuration) and hinges that couple the bodies to each other. The hinge described in Japanese Patent Application Laid-open Publication No. 2021-118273 includes a plurality of arcs and has a meandering shape. When a tensile load acts on the stretchable device, the arcs of the hinge deform to expand. As a result, the bodies are separated from each other, and the stretchable device extends.

The array layer of the stretchable device may be provided with thin-film transistors (hereinafter, which may be abbreviated as "TFTs"). As described in Japanese Patent Application Laid-open Publication No. 2023-28988, impurities are implanted into the semiconductor layer of the TFTs during the process of manufacturing the TFTs.

To detect the load acting on a stretchable device, it has recently been considered to provide strain gauges to the hinges and detect the amount of strain (amount of deformation) of the hinges. It has also been considered to use a semiconductor strain gauge made of semiconductor material having a higher gauge factor than metal material as the strain gauge. If the semiconductor strain gauge and the TFT are manufactured in the same process, the semiconductor strain gauge has the same impurity concentration as that of the TFT. While the semiconductor strain gauge with the same impurity concentration as that of the TFT has a higher gauge factor than a metal strain gauge, a semiconductor strain gauge with still higher sensitivity is required.

For the foregoing reasons, there is a need for a stretchable device including a semiconductor strain gauge with high sensitivity.

SUMMARY

According to an aspect, a stretchable device includes a first stretchable resin, a resin base member, an array layer, and a second stretchable resin stacked in the order as listed. The resin base member includes: a plurality of bodies; and a plurality of hinges that couple the bodies.

The array layer includes: a plurality of thin-film transistors disposed at the bodies; and a plurality of strain gauges disposed at the hinges. The strain gauges each include a semiconductor strain gauge made of semiconductor material at a part in a longitudinal direction. An impurity concentration of the semiconductor strain gauge is higher than an impurity concentration of the thin-film transistor.

DETAILED DESCRIPTION

Figure 1:
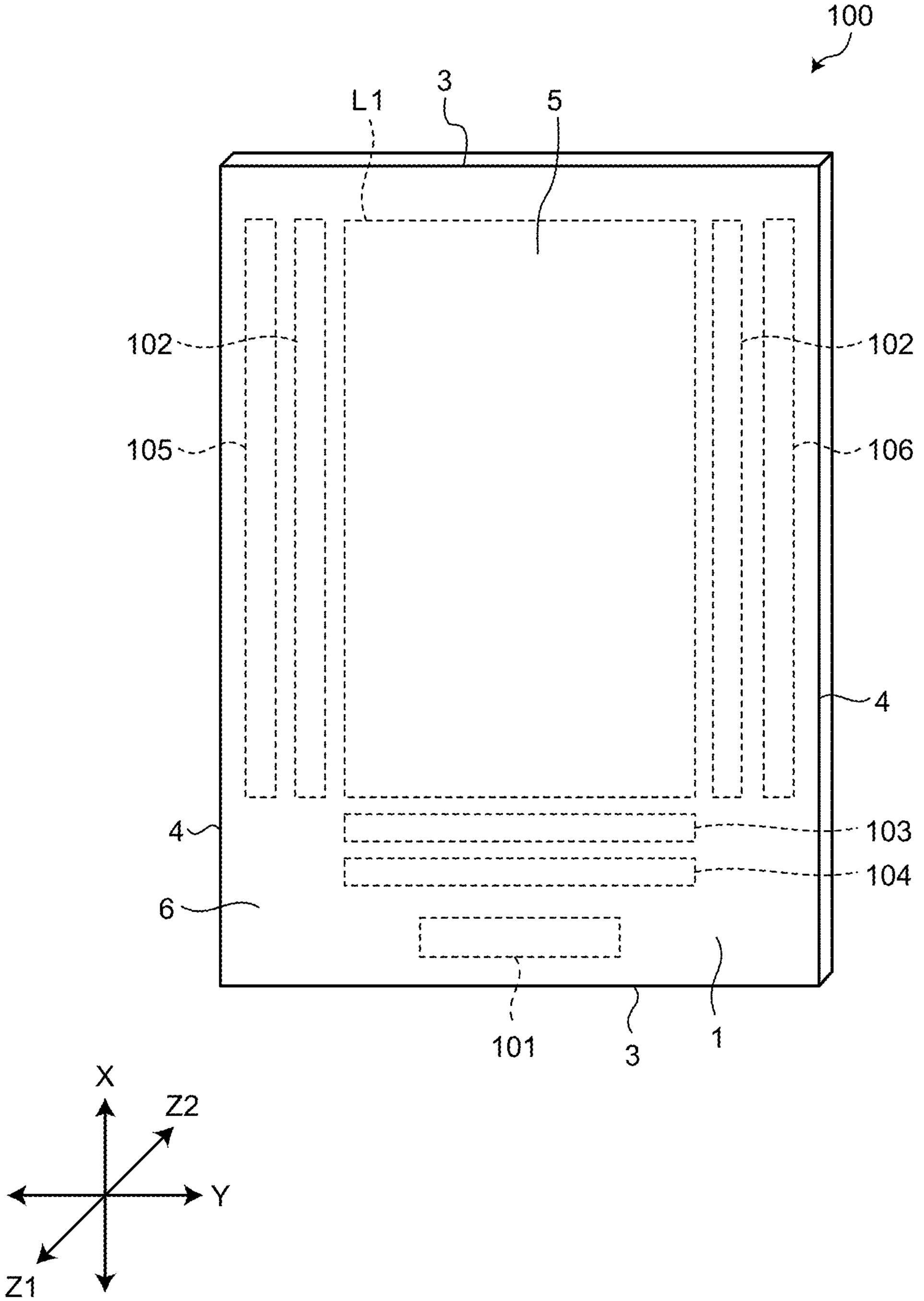
FIG. 1 is a schematic perspective view of a stretchable device according to an embodiment.

Exemplary aspects (embodiments) to embody the present disclosure are described below in greater detail with reference to the accompanying drawings. The contents described in the embodiments below are not intended to limit the disclosure according to the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the drawings, components similar to those previously described with reference to previous drawings are denoted by the same reference numerals, and detailed explanation thereof may be appropriately omitted.

When the term "on" is used to describe an aspect where a first structure is disposed on or above a second structure in the present specification and the claims, it includes both of the following cases unless otherwise noted: a case where the first structure is disposed on and in contact with the second structure, and a case where the first structure is disposed above the second structure with still another structure interposed therebetween.

Embodiment

FIG. 1 is a schematic perspective view of a stretchable device according to an embodiment. As illustrated in FIG. 1, this stretchable device 100 has a flat plate shape. The stretchable device 100 has a surface 1 and a back surface 2 (not illustrated in FIG. 1, and refer to FIG. 2) facing opposite to each other.

In the following description, the direction parallel to the surface 1 and the back surface 2 is referred to as a planar direction. A direction parallel to the planar direction is referred to as a first direction X. A direction parallel to the planar direction and intersecting the first direction X is referred to as a second direction Y.

The stretchable device 100 has a rectangular (quadrilateral) shape in plan view. Therefore, the surface 1 has a pair of short sides 3 and a pair of long sides 4. The long side 4 is parallel to the first direction X. The short side 3 is parallel to the second direction Y. Thus, the first direction X and the second direction Y according to the present embodiment are orthogonal to each other.

The stretchable device 100 has a detection region 5 and a peripheral region 6 in plan view. The detection region 5 is a region in which the load applied to the stretchable device 100 can be detected. The peripheral region 6 has a frame-like shape and surrounds the outer periphery of the detection region 5. In FIG. 1, a boundary line L1 is illustrated to make the boundary between the detection region 5 and the peripheral region 6 easy to understand.

Figure 2:
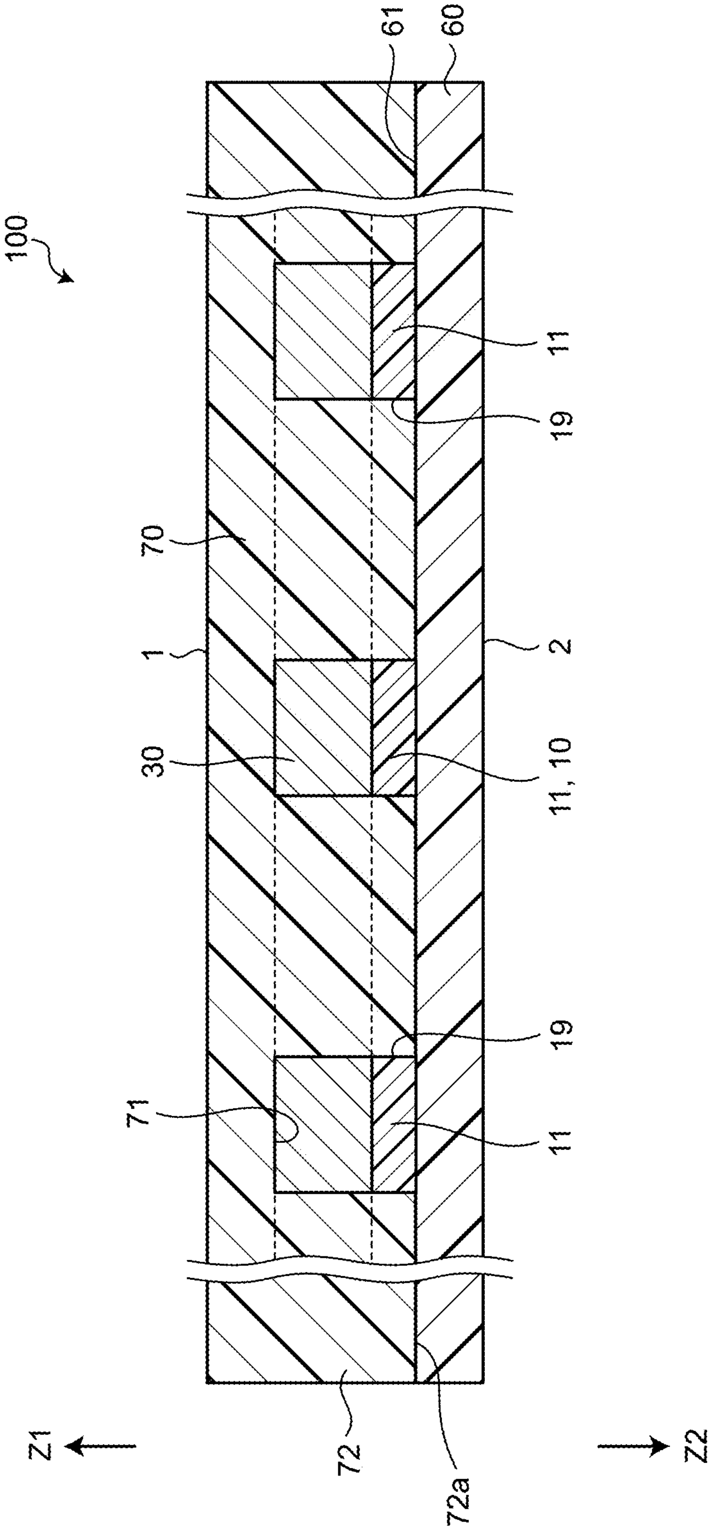
FIG. 2 is a schematic of a section of the stretchable device according to the embodiment, and more specifically a sectional view along line II-II of FIG. 3.
Figure 3:
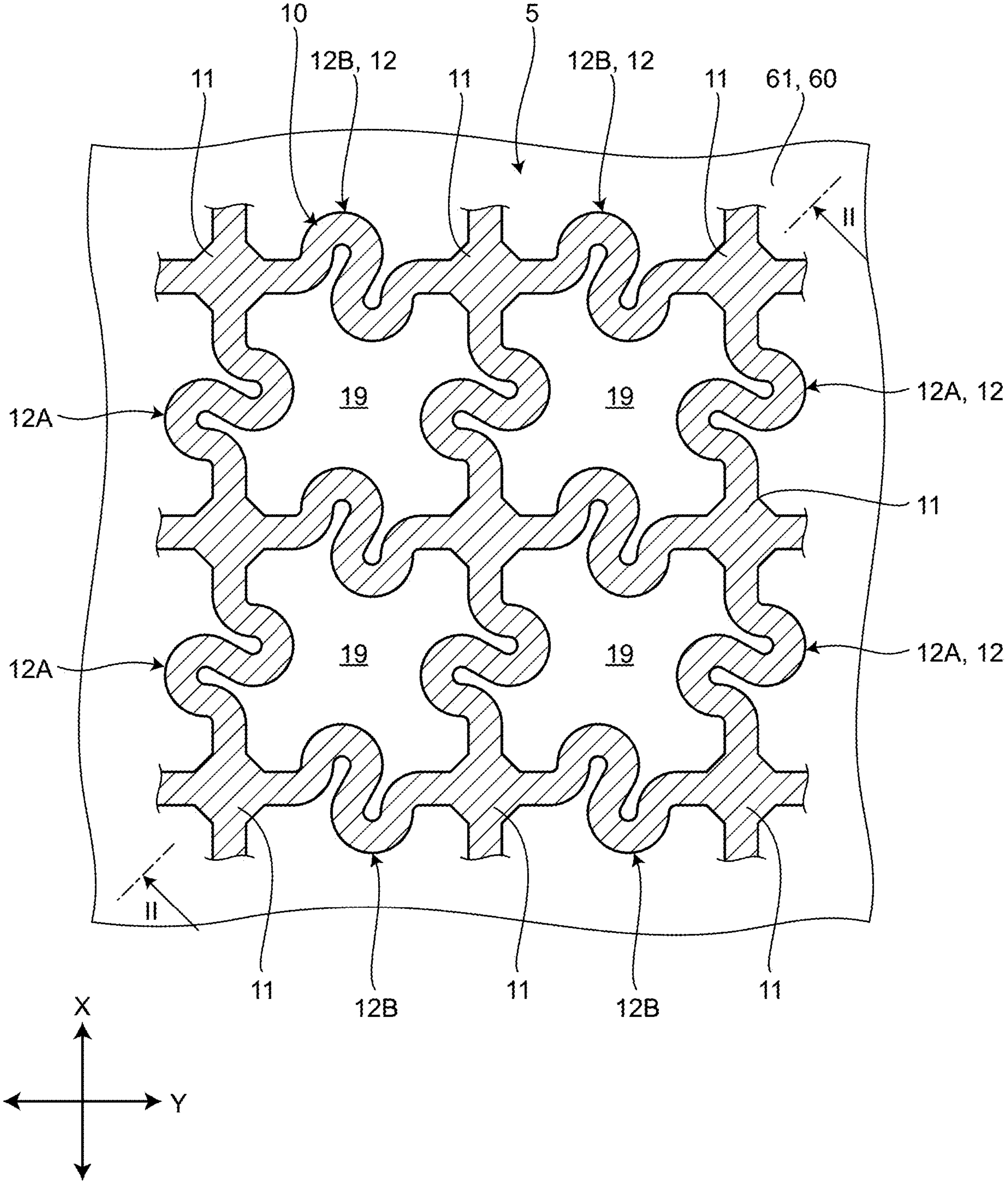
FIG. 3 is an enlarged view of part of a resin base member viewed from the surface of the stretchable device according to the embodiment.

FIG. 2 is a schematic of a section of the stretchable device according to the embodiment, and more specifically a sectional view along line II-II of FIG. 3. As illustrated in FIG. 2, the stretchable device 100 includes a first stretchable resin 60, a resin base member 10, an array layer 30, and a second stretchable resin 70 stacked in the order as listed.

The direction in which the first stretchable resin 60, the resin base member 10, the array layer 30, and the second stretchable resin 70 are stacked is hereinafter referred to as a thickness direction. In the thickness direction, the direction in which the second stretchable resin 70 is disposed when viewed from the first stretchable resin 60 is referred to as a first thickness direction Z1, and the direction opposite to the first thickness direction Z1 is referred to as a second thickness direction Z2. The view of the stretchable device 100 from the first thickness direction Z1 is referred to as plan view.

The first stretchable resin 60 and the second stretchable resin 70 have insulating, elastic, and flexible properties. The resin used as the first stretchable resin 60 and the second stretchable resin 70 is acrylic elastomer, for example. The first stretchable resin 60 and the second stretchable resin 70 according to the present disclosure are not limited to acrylic elastomer. They may be acrylic resin, epoxy resin, urethane resin, or the like and are not particularly limited.

The first stretchable resin 60 and the second stretchable resin 70 are formed in a plate shape and extend in the planar direction. The surface of the first stretchable resin 60 in the second thickness direction Z2 serves as the back surface 2 of the stretchable device 100. The first stretchable resin 60 has a first surface 61 facing the first thickness direction Z1. The resin base member 10 is stacked on the first surface 61.

The surface of the second stretchable resin 70 in the first thickness direction Z1 serves as the surface 1 of the stretchable device 100. A surface 71 of the second stretchable resin 70 in the second thickness direction Z2 adheres to the array layer 30. The ends of the second stretchable resin 70 in the first direction X and in the second direction Y are provided with a frame part 72 that protrudes in the second thickness direction Z2 from the surface 71.

The frame part 72 is formed in an annular shape in plan view and surrounds the outer periphery of the resin base member 10 and the array layer 30. A surface 72*a* of the frame part 72 in the second thickness direction Z2 adheres to the first surface 61 of the first stretchable resin 60. Thus, the first stretchable resin 60 and the second stretchable resin 70 cooperate to serve as a housing that accommodates the resin base member 10 and the array layer 30.

The resin base member 10 adheres to the first surface 61 of the first stretchable resin 60. The resin base member 10 has elastic, flexible, and insulating properties. The resin base member 10 is made of resin material, such as polyimide.

FIG. 3 is an enlarged view of part of the resin base member viewed from the surface of the stretchable device according to the embodiment. As illustrated in FIG. 3, the resin base member 10 includes a plurality of bodies 11 and a plurality of hinges 12 meandering and extending in the planar direction. The bodies 11 and the hinges 12 are disposed in the detection region 5 in plan view.

The body 11 has a quadrilateral (square) shape in plan view. The body 11 is disposed with its four corners facing the first direction X and the second direction Y. The bodies 11 are arrayed in the first direction X and the second direction Y and are separated from one another. The shape of the body 11 according to the present disclosure in plan view is not limited to a quadrilateral shape and may be circular or other polygonal shapes.

The hinge 12 couples the bodies 11 adjacent to each other. The hinges 12 include two kinds of hinges: a longitudinal hinge 12A extending in the first direction X, and a lateral hinge 12B extending in the second direction Y. The part not provided with the bodies 11 or the hinges 12 in the resin base member 10 serves as a through hole 19 passing through the resin base member 10 in the thickness direction. In other words, the resin base member 10 has a plurality of through holes 19.

As illustrated in FIG. 2, the array layer 30 is not stacked in the regions overlapping the through holes 19. The through holes 19 are filled with the second stretchable resin 70. With this configuration, the stretchable device 100 has low rigidity in the regions overlapping the through holes 19 and has elasticity and bendability (stretchability). Specifically, when a load acts on the stretchable device 100, the hinges 12 deform. By contrast, the bodies 11 are less deformed, thereby reducing damage to functional elements (thin-film transistors 40) stacked on the bodies 11.

While the through hole 19 according to the present embodiment is filled with the second stretchable resin 70, the through hole 19 according to the present disclosure may be filled with the first stretchable resin 60. Alternatively, the through hole 19 may be filled with both the first stretchable resin 60 and the second stretchable resin 70. Still alternatively, the through hole 19 may be filled with resin material other than the first stretchable resin 60 or the second stretchable resin 70. Still alternatively, the through hole 19 may be a space provided with nothing.

The following describes the hinge 12 in greater detail. When the longitudinal hinge 12A is rotated by 90 degrees, it has the same shape as that of the lateral hinge 12B. Therefore, the longitudinal hinge 12A is described below as a representative example.

Figure 4:
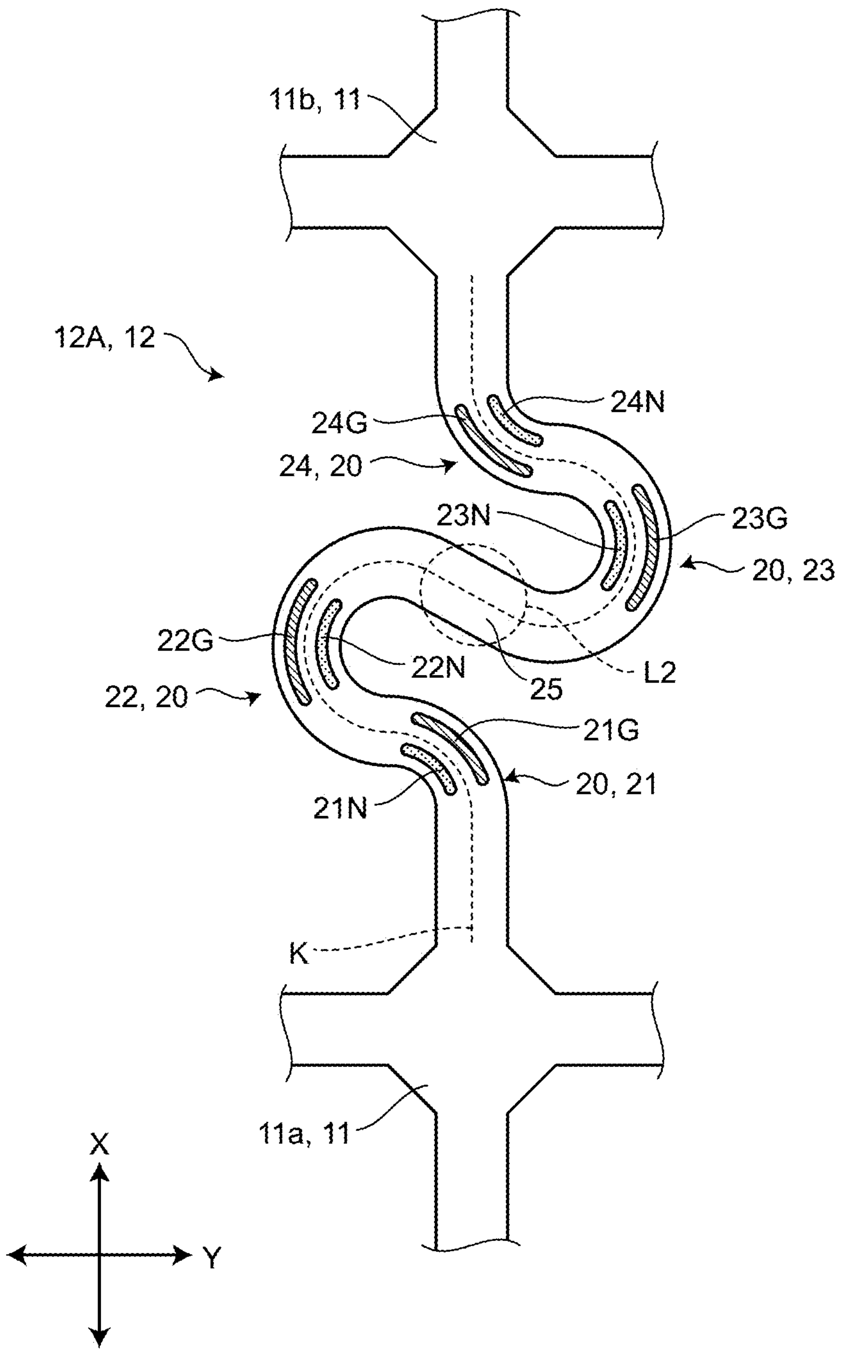
FIG. 4 is an enlarged view of a first hinge according to the embodiment.
Figure 5:
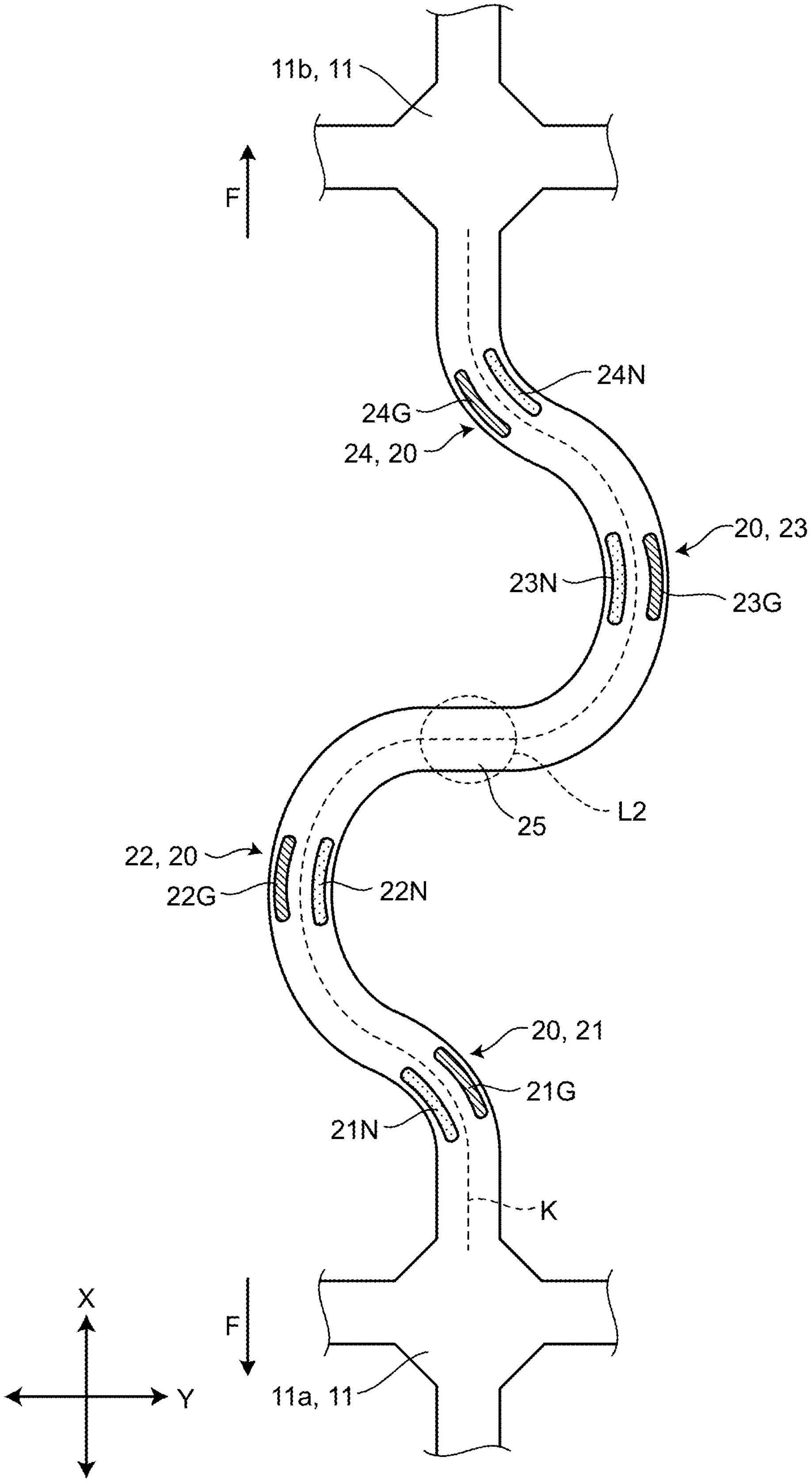
FIG. 5 is an enlarged view of a longitudinal hinge according to the embodiment when a load that stretches the longitudinal hinge in a first direction is applied.

FIG. 4 is an enlarged view of a first hinge according to the embodiment. FIG. 5 is an enlarged view of the longitudinal hinge according to the embodiment when a load that stretches the longitudinal hinge in the first direction is applied. An imaginary line K illustrated in FIGS. 4 and 5 passes through the center of the longitudinal hinge 12A in the width direction. For the convenience of explanation, one of the two bodies 11 that sandwich the longitudinal hinge 12A is referred to as a first body 11*a*, and the other is referred to as a second body 11*b*.

As illustrated in FIG. 4, the longitudinal hinge 12A has four bends 20 and extends in the first direction X while meandering. Each bend 20 according to the present embodiment has an arc shape. The bend according to the present disclosure does not necessarily have an arc shape and may have an angular shape. The number of bends is not limited to four.

The four bends 20 are a first arc 21, a second arc 22, a third arc 23, and a fourth arc 24 arranged in the order as listed, from the first body 11*a* to the second body 11*b*. The first arc 21 and the fourth arc 24 each form a quadrant and are bent at 90 degrees. The second arc 22 and the third arc 23 each form a semi-circular arc and are bent at 180 degrees. A linear coupling part 25 is provided between the second arc 22 and the third arc 23.

Each bend 20 is divided into two portions with the imaginary line K as the boundary: an inner peripheral portion (a first inner peripheral portion 21N, a second inner peripheral portion 22N, a third inner peripheral portion 23N, and a fourth inner peripheral portion 24N) positioned on the inner side (inner peripheral side), and an outer peripheral portion (a first outer peripheral portion 21G, a second outer peripheral portion 22G, a third outer peripheral portion 23G, and a fourth outer peripheral portion 24G) positioned on the outer side (outer peripheral side). In FIG. 4, the inner peripheral portion and the outer peripheral portion of each bend 20 are enclosed by ellipses to define the areas of the inner peripheral portion and the outer peripheral portion. However, the entire area on the inner peripheral side with respect to the imaginary line K is the inner peripheral portion, and the entire area on the outer peripheral side with respect to the imaginary line K is the outer peripheral portion. Therefore, the area enclosed by the ellipse in FIG. 4 is part of the inner peripheral portion or the outer peripheral portion.

As illustrated in FIG. 5, when a tensile load in the first direction X (refer to arrow F in FIG. 5) acts on the stretchable device 100, the first arc 21, the second arc 22, the third arc 23, and the fourth arc 24 are each deformed such that the curvature decreases. As a result, the distance from one end of the longitudinal hinge 12A to the other increases, and the bodies 11 move away from each other. When the bending angle of each bend 20 increases, the following loads (stresses) act on the inner peripheral portion and the outer peripheral portion of each bend 20.

A tensile load acts on a first inner peripheral portion 21N of the first arc 21. A compressive load acts on a first outer peripheral portion 21G of the first arc 21. A tensile load acts on a second inner peripheral portion 22N of the second arc 22. A compressive load acts on a second outer peripheral portion 22G of the second arc 22. A tensile load acts on a third inner peripheral portion 23N of the third arc 23. A compressive load acts on a third outer peripheral portion 23G of the third arc 23. A tensile load acts on a fourth inner peripheral portion 24N of the fourth arc 24. A compressive load acts on a fourth outer peripheral portion 24G of the fourth arc 24. As a result, a tensile strain is generated in the inner peripheral portion of each bend 20, and a compressive strain is generated in the outer peripheral portion of each bend 20.

When a compressive load in the first direction X acts on the longitudinal hinge 12A, the first arc 21, the second arc 22, the third arc 23, and the fourth arc 24 are each deformed such that the curvature increases, which is not specifically illustrated. As a result, the distance from one end of the longitudinal hinge 12A to the other decreases, and the bodies 11 move closer to each other. A compressive load acts on the inner peripheral portion of each bend 20, and a tensile load acts on the outer peripheral portion of each bend 20.

As described above, when a load acts on the longitudinal hinge 12A, large strains are generated in the inner peripheral portion and the outer peripheral portion of each bend 20. By contrast, the longitudinal hinge 12A may have a region where the amount of deformation is kept to 1% or smaller (deformation reduction region L2) unlike the bends 20. As illustrated in FIGS. 4 and 5, the coupling part 25 between the second arc 22 and the third arc 23 according to the present embodiment corresponds to the deformation reduction region L2. In other words, the amount of deformation of the coupling part 25 is kept to 1% or smaller when a load acts on the longitudinal hinge 12A.

The array layer 30 includes a plurality of insulating layers (not illustrated) stacked in the thickness direction and a load detection circuit buried in the insulating layers and insulated from the outside. The load detection circuit is a circuit that detects a load applied to the stretchable device 100.

Figure 6:
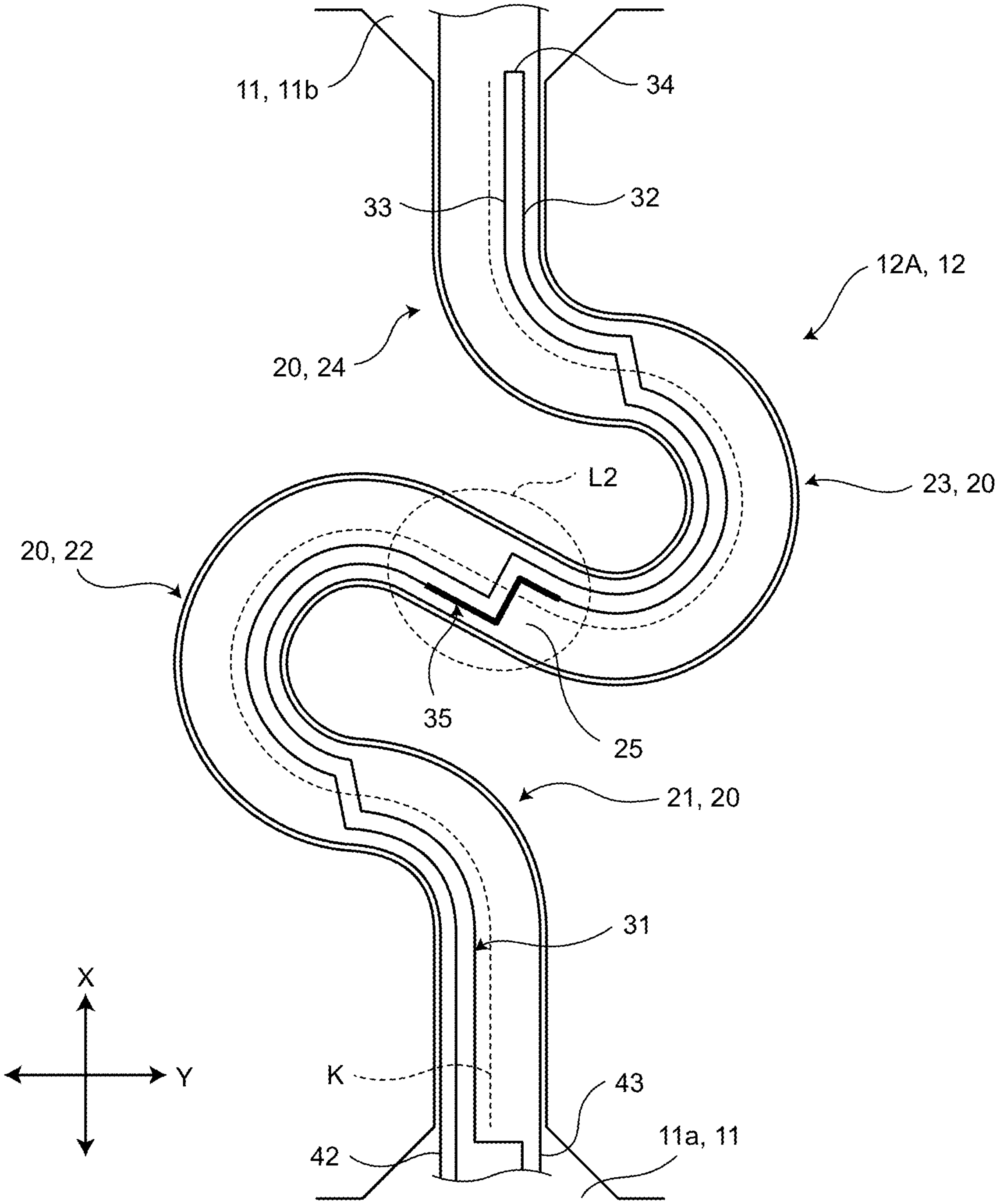
FIG. 6 is a schematic plan view of components of a load detection circuit disposed at a hinge according to the embodiment.
Figure 7:
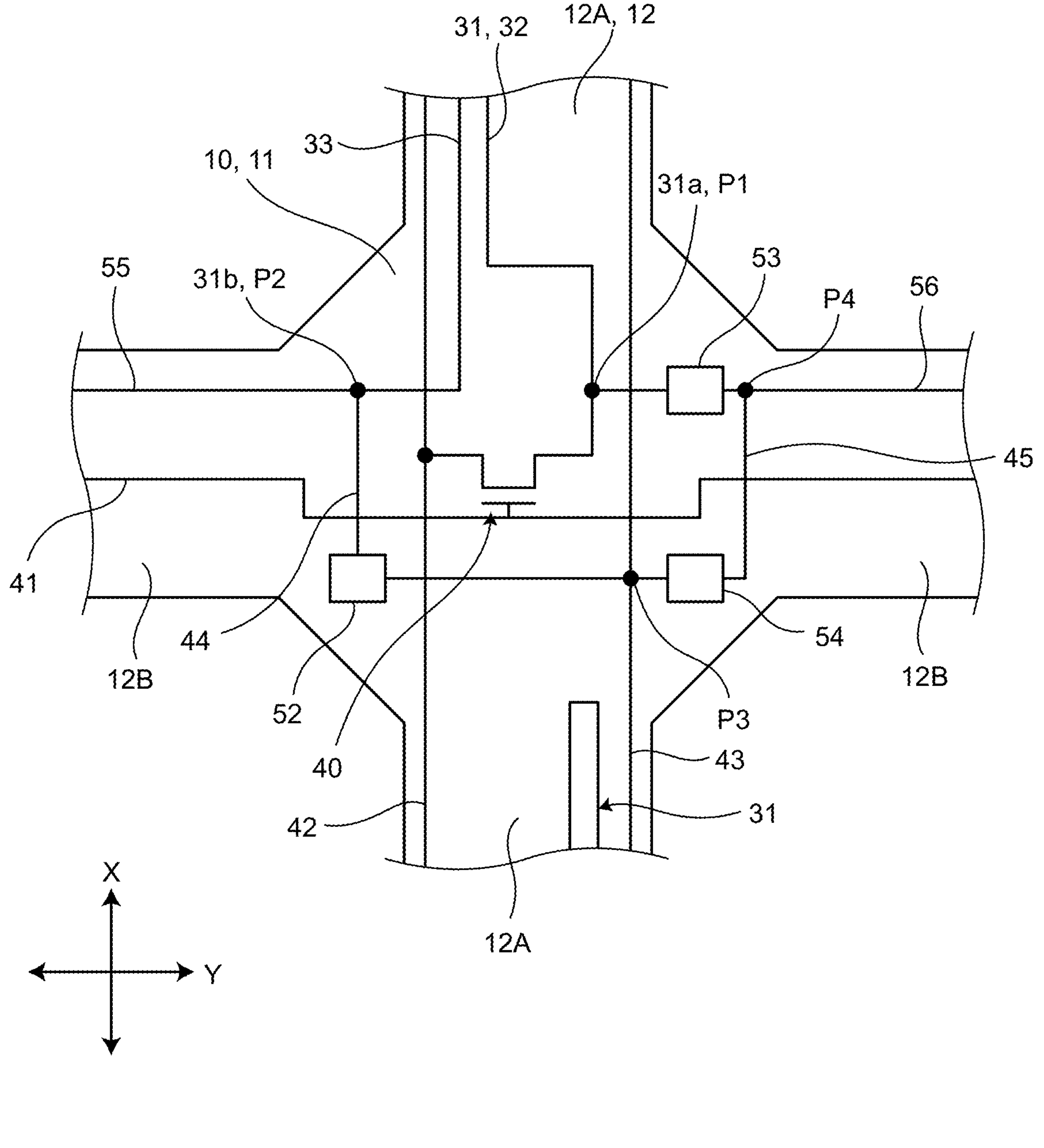
FIG. 7 is a schematic plan view of the components of the load detection circuit disposed at a body according to the embodiment.

FIG. 6 is a schematic plan view of the components of the load detection circuit disposed at the hinge according to the embodiment. FIG. 7 is a schematic plan view of the components of the load detection circuit disposed at the body according to the embodiment. As illustrated in FIGS. 6 and 7, the load detection circuit includes a strain gauge 31 (refer to FIG. 6), a thin-film transistor 40 (refer to FIG. 7), a gate line 41 (refer to FIG. 7), a first signal line 42, a second signal line 43, first wiring 44 (refer to FIG. 7), second wiring 45 (refer to FIG. 7), a second resistor 52 (refer to FIG. 7), a third resistor 53 (refer to FIG. 7), a fourth resistor 54 (refer to FIG. 7), a first potential detection line 55 (refer to FIG. 7), and a second potential detection line 56 (refer to FIG. 7).

As illustrated in FIG. 6, the strain gauge 31 is provided only to each longitudinal hinge 12A. While the strain gauge 31 according to the present embodiment is provided only to the longitudinal hinge 12A, the strain gauge 31 according to the present disclosure may be provided only to the lateral hinge 12B or to both the longitudinal hinge 12A and the lateral hinge 12B.

The strain gauge 31 includes a first strain gauge 32, a second strain gauge 33, and a folded part 34. The first strain gauge 32 and the second strain gauge 33 extend along the longitudinal hinge 12A and are disposed parallel to each other. The first strain gauge 32 and the second strain gauge 33 are disposed overlapping the inner peripheral portions (the first inner peripheral portion 21N, the second inner peripheral portion 22N, the third inner peripheral portion 23N, and the fourth inner peripheral portion 24N, refer to FIGS. 4 and 5) at the respective bends 20 of the hinge 12. Therefore, when the longitudinal hinge 12A is deformed, a strain (a tensile strain or a compressive strain) common to the parts overlapping the respective bends 20 is generated in the first strain gauge 32 and the second strain gauge 33.

The folded part 34 is disposed at the second body 11*b* and couples the ends of the first strain gauge 32 and the second strain gauge 33. Therefore, the strain gauge 31 according to the present embodiment extends from the first body 11*a* to the second body 11*b*, folds back from the second body, and returns to the first body 11*a*. Thus, the strain gauge 31 according to the present embodiment includes two strain gauges (the first strain gauge 32 and the second strain gauge 33). Therefore, the strain gauge 31 can detect a larger amount of strain and has higher detection sensitivity than in a case where it is composed of one strain gauge. The strain gauge according to the present disclosure may be composed of one strain gauge.

The second strain gauge 33 is a metal strain gauge the whole part in the longitudinal direction of which is made of metal material. By contrast, a part of the first strain gauge 32 is a semiconductor strain gauge 35, and the other part is a metal strain gauge. The semiconductor strain gauge 35 has a higher gauge factor than the metal strain gauge. Therefore, the strain gauge 31 has higher sensitivity than in a case where its whole part in the longitudinal direction is made of metal material. In FIG. 6, only the part corresponding to the semiconductor strain gauge 35 is represented by a thick line to make it easier to recognize the part of the semiconductor strain gauge 35.

The material of the semiconductor strain gauge 35 is polysilicon, for example. By implanting impurities into polysilicon, the semiconductor strain gauge 35 made of P-type polysilicon is manufactured. Examples of the elements of the impurities include, but are not limited to, hydrogen, argon, phosphorus, boron, etc. The semiconductor strain gauge 35 is simultaneously manufactured in the process of manufacturing the semiconductor layer (not illustrated) of the thin-film transistor 40. However, implanting the impurities into the semiconductor strain gauge 35 and implanting the impurities into the semiconductor layer of the thin-film transistor 40 are separately performed. The semiconductor strain gauge 35 has an impurity concentration different from that of the semiconductor layer of the thin-film transistor 40. The semiconductor strain gauge 35 according to the present embodiment has an impurity concentration higher than that of the semiconductor layer of the thin-film transistor 40 by 30%. Therefore, the semiconductor strain gauge 35 has a higher gauge factor and higher sensitivity than in a case where it has the impurity concentration equal to that of the semiconductor layer of the thin-film transistor 40.

The semiconductor strain gauge 35 is disposed at the coupling part 25 (deformation reduction region L2) of the longitudinal hinge 12A. Therefore, a load is less likely to act on the semiconductor strain gauge 35, whereby damage to the semiconductor strain gauge 35 is suppressed.

The semiconductor strain gauge 35 according to the present disclosure may be provided not in the first strain gauge 32 but in the second strain gauge 33. Alternatively, the semiconductor strain gauges 35 may be provided in both the first strain gauge 32 and the second strain gauge 33. The percentage of the semiconductor strain gauge 35 preferably falls within a range of 10% to 20% of the strain gauge 31 in the longitudinal direction.

As illustrated in FIG. 7, one end of the first strain gauge 32 (start end 31*a* of the strain gauge 31) is disposed at the first body 11*a*. One end of the second strain gauge 33 (terminal end 31*b* of the strain gauge 31) is disposed at the first body 11*a*.

As illustrated in FIG. 7, the thin-film transistor 40 is disposed at the body 11. Therefore, a plurality of thin-film transistors 40 are arrayed in a matrix (row-column configuration) in the first direction X and the second direction Y corresponding to the respective bodies 11. The thin-film transistor 40 according to the present embodiment is a top-gate transistor.

The thin-film transistor 40 includes a semiconductor layer, a gate insulating film stacked on the semiconductor layer, a gate electrode stacked on the gate insulating film, a source electrode stacked on a part of the semiconductor layer, and a drain electrode stacked on another part of the semiconductor layer, which are not specifically illustrated. A gate insulating film is disposed between the source electrode and the drain electrode. The semiconductor layer is doped with impurities at the parts coupled to the source electrode and the drain electrode and has a predetermined impurity concentration. The source electrode of the thin-film transistor 40 is coupled to the start end 31*a* of the strain gauge 31. The coupling point between the thin-film transistor 40 and the start end 31*a* of the strain gauge 31 is hereinafter referred to as a first coupling point P1.

The gate line 41 is disposed over a plurality of lateral hinges 12B and a plurality of bodies 11 and extends in the second direction Y. A plurality of gate lines 41 are disposed in the first direction X. The gate line 41 is coupled to the gate electrode of the thin-film transistor 40. Therefore, a plurality of thin-film transistors 40 disposed in the second direction Y share one gate line 41.

As illustrated in FIG. 6, the first signal line 42 is disposed over a plurality of longitudinal hinges 12A and a plurality of bodies 11 and extends in the first direction X. Similarly, the second signal line 43 is disposed over a plurality of longitudinal hinges 12A and a plurality of bodies 11 and extends in the first direction. Although not specifically illustrated, a plurality of first signal lines 42 and a plurality of second signal lines 43 are disposed in the second direction Y.

As illustrated in FIG. 7, the first signal line 42 is coupled to the drain electrode of the thin-film transistor 40 in each body 11. Therefore, a plurality of thin-film transistors arrayed in the first direction X share one first signal line 42.

The first wiring 44 is disposed at the body 11. One end of the first wiring 44 is coupled to the terminal end 31*b* of the strain gauge 31. The coupling point between the first wiring 44 and the terminal end 31*b* of the strain gauge 31 is hereinafter referred to as a first intermediate point P2. The other end of the first wiring 44 is coupled to the second signal line 43. The coupling point between the first wiring 44 and the second signal line 43 is hereinafter referred to as a second coupling point P3. Since the first wiring 44 is provided at each body 11, a plurality of thin-film transistors 40 disposed in the first direction X share one second signal line 43. The second resistor 52 is provided to the first wiring 44.

The second wiring 45 is disposed at the body 11. The second wiring 45 couples the first coupling point P1 and the second coupling point P3. Therefore, the second wiring 45 is a circuit parallel to the circuit composed of the strain gauge 31 and the first wiring 44 with the start end 31*a* of the strain gauge 31 as a branch point. The third resistor 53 and the fourth resistor 54 are provided to the second wiring 45. A point positioned between the third resistor 53 and the fourth resistor 54 in the second wiring 45 is hereinafter referred to as a second intermediate point P4.

The first potential detection line 55 is wiring extending from the first intermediate point P2 to detect the potential of the terminal end 31*b* of the strain gauge 31. The second potential detection line 56 is electric wiring extending from the second intermediate point P4 of the second wiring 45 to detect the potential of the second intermediate point P4 of the second wiring 45. The first potential detection line 55 is disposed over a plurality of lateral hinges 12B and a plurality of bodies 11 and extends on one side in the second direction Y. The second potential detection line 56 is disposed over a plurality of lateral hinges 12B and a plurality of bodies 11 and extends on the other side in the second direction Y.

As described above, the circuit including the strain gauge 31 according to the present embodiment serves as a Wheatstone bridge circuit. The following describes the Wheatstone bridge circuit in detail.

Figure 8:
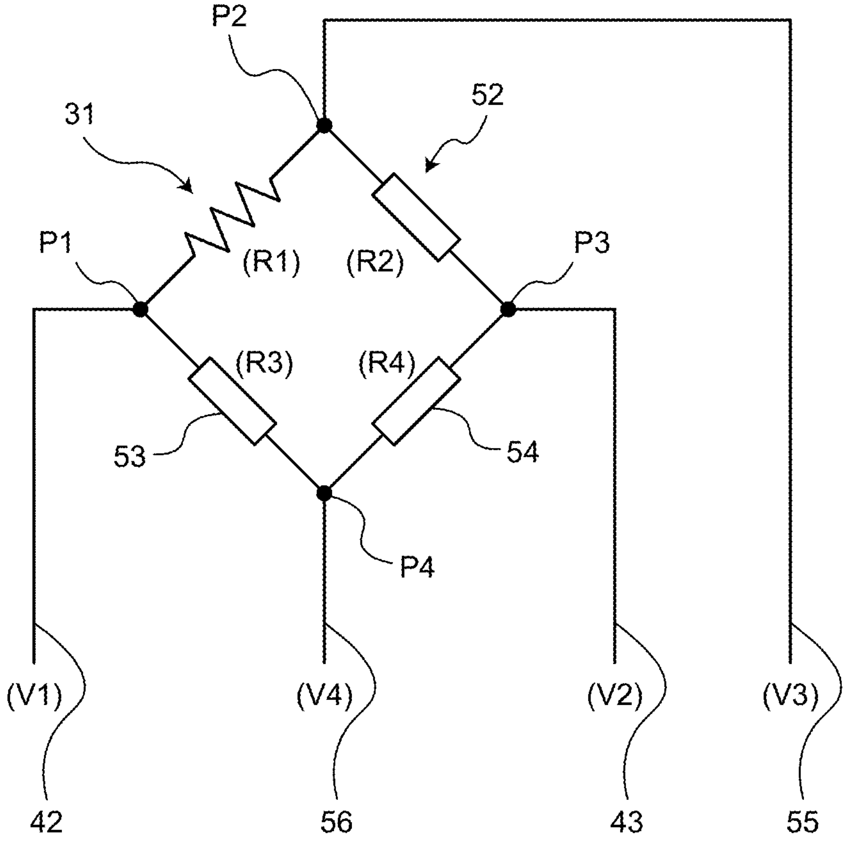
FIG. 8 is a diagram schematically illustrating a Wheatstone bridge circuit according to the embodiment.

FIG. 8 is a diagram schematically illustrating the Wheatstone bridge circuit according to the embodiment. A second resistance R2 of the second resistor 52, a third resistance R3 of the third resistor 53, and a fourth resistance R4 of the fourth resistor 54 are equal to a first resistance R1 of the strain gauge 31 when the hinge 12 is not deformed (R1=R2=R3=R4). The second resistor 52, the third resistor 53, and the fourth resistor 54 are provided to the body 11. Therefore, the amount of change in their resistances is zero when the hinge 12 is deformed.

As illustrated in FIG. 8, to detect the amount of strain by the strain gauge 31, the first signal line 42 is supplied with a detection signal having a predetermined first potential V1. The second signal line 43 is supplied with a second potential V2 lower than the first potential V1 (V2>V1). The second potential V2 according to the present embodiment is 0 V. Therefore, when the thin-film transistor 40 is ON, the potential of the first coupling point P1 (start end 31*a* of the strain gauge 31) becomes the first potential V1.

When the hinge 12 is not deformed, the first resistance R1 of the strain gauge 31 does not change. Thus, the first resistance R1 of the strain gauge 31, the second resistance R2 of the second resistor 52, the third resistance R3 of the third resistor 53, and the fourth resistance R4 of the fourth resistor 54 are equal to one another. Therefore, a potential V3 of the first intermediate point P2 read by the first potential detection line 55 is equal to a potential V4 of the second intermediate point P4 read by the second potential detection line 56.

By contrast, when the hinge 12 is deformed, and strain is generated in the strain gauge 31, the first resistance R1 changes, and the potential V3 of the first intermediate point P2 changes. As a result, a potential difference is generated between the first intermediate point P2 and the second intermediate point P4. Therefore, the amount of change in resistance of the strain gauge 31 can be detected by detecting the potential V3 and the potential V4.

As illustrated in FIG. 1, the array layer 30 includes a coupler 101, gate line drive circuits 102, a first signal line selection circuit 103, a second signal line selection circuit 104, a first potential detection line selection circuit 105, and a second potential detection line selection circuit 106 disposed in the peripheral region 6 to drive the load detection circuit.

The coupler 101 is coupled to a drive integrated circuit (IC) disposed outside the stretchable device 100. The drive IC may be mounted as a chip on film (COF) on a flexible printed circuit board or a rigid board, which is not illustrated, and coupled to the coupler 101. Alternatively, the drive IC may be mounted as a chip on glass (COG) in the peripheral region 6 of the first stretchable resin 60.

The gate line drive circuit 102 is a circuit that drives a plurality of gate lines 41 (refer to FIG. 7) based on various control signals supplied from the drive IC. The gate line drive circuit 102 sequentially or simultaneously selects the gate lines 41 and supplies gate drive signals to the selected gate line 41.

The first signal line selection circuit 103 is a switch circuit that sequentially or simultaneously selects a plurality of first signal lines 42. The first signal line selection circuit 103 couples the first signal line 42 to the drive IC based on selection signals supplied from the drive IC. As a result, the predetermined first potential V1 is applied to the first signal line 42.

The second signal line selection circuit 104 is a switch circuit that sequentially or simultaneously selects a plurality of second signal lines 43. The second signal line selection circuit 104 couples the second signal line 43 to the drive IC based on selection signals supplied from the drive IC. As a result, the predetermined second potential V2 is applied to the second signal line 43. The second potential V2 according to the present embodiment is 0 V.

The first potential detection line selection circuit 105 is a switch circuit that sequentially or simultaneously selects a plurality of first potential detection lines 55. The first potential detection line selection circuit 105 couples the selected first potential detection line 55 to the drive IC based on selection signals supplied from the drive IC. As a result, the potential V3 of the first intermediate point P2 is transmitted to the drive IC.

The second potential detection line selection circuit 106 is a switch circuit that sequentially or simultaneously selects a plurality of second potential detection lines 56. The second potential detection line selection circuit 106 couples the selected second potential detection line 56 to the drive IC based on selection signals supplied from the drive IC. As a result, the potential V4 of the second intermediate point P4 is transmitted to the drive IC.

While the embodiment has been described above, the present disclosure is not limited to the example described in the embodiment. For example, the semiconductor strain gauge 35 is provided only to the coupling part 25 of the hinge 12, but the semiconductor strain gauge 35 according to the present disclosure may be provided to a part other than the coupling part 25. In other words, if the hinge 12 has the deformation reduction region L2 other than the coupling part 25, the semiconductor strain gauge 35 may be disposed in the deformation reduction region L2 other than the coupling part 25. The reason why the semiconductor strain gauge 35 is disposed in the deformation reduction region L2 is to reduce damage to the semiconductor strain gauge 35. Therefore, the semiconductor strain gauge 35 according to the present disclosure may be disposed at a position other than the deformation reduction region L2, although it is more likely to be damaged.

EXAMPLE

Figure 9:
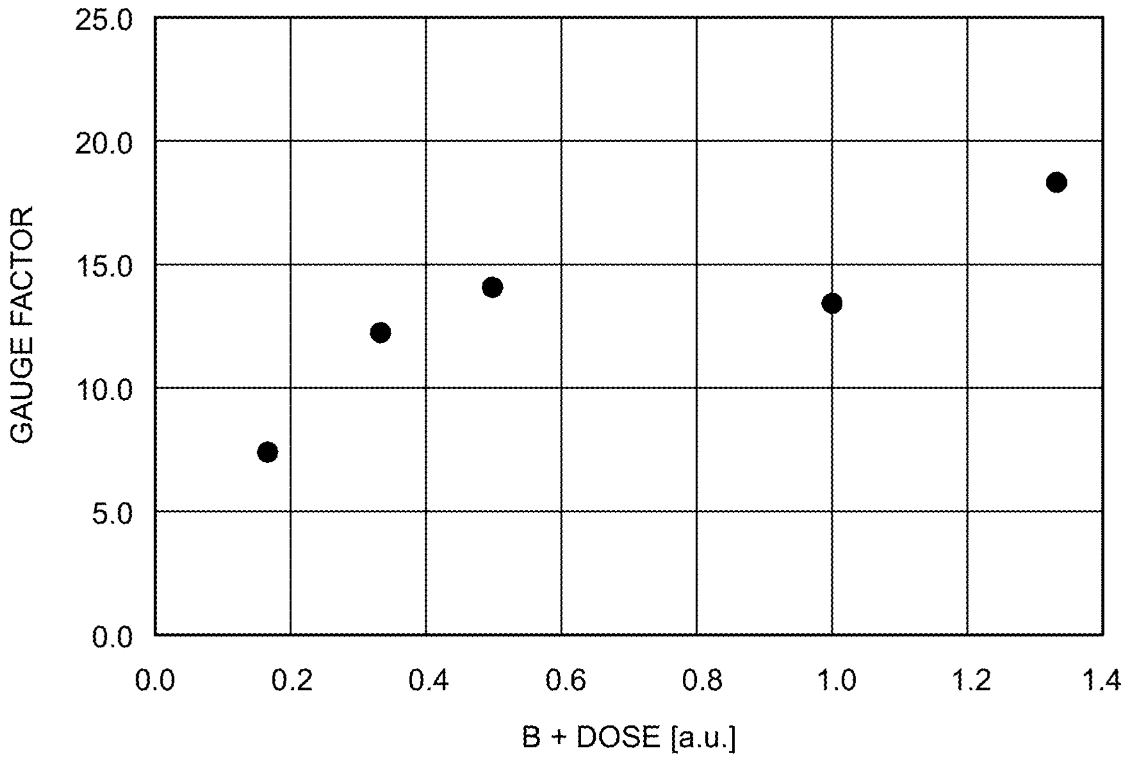
FIG. 9 is a diagram (graph) indicating experimental data of an example.

FIG. 9 is a diagram (graph) indicating experimental data of an example. The following describes the example. To confirm the advantageous effects of the semiconductor strain gauge, five semiconductor strain gauges with different impurity concentrations were fabricated as samples. The impurity concentrations of the five semiconductor strain gauges were set to 0.16, 0.33, 0.5, 1, and 1.33 times the impurity concentration of the semiconductor layer of the thin-film transistor. The semiconductor strain gauge having an impurity concentration of 1.33 times is the example, and the other semiconductor strain gauges are comparative examples. The gauge factors of the respective five semiconductor strain gauges were derived. The implanted impurity is boron. The results of the gauge factor are illustrated in FIG. 9.

As illustrated in FIG. 9, the semiconductor strain gauge with an impurity concentration of 1.0 time (impurity concentration equal to that of the semiconductor layer of the thin-film transistor) had a gauge factor of approximately 13.5. The gauge factors of the semiconductor strain gauges with impurity concentrations of 0.16, 0.33, and 0.5 times were substantially equal to or lower than the gauge factor of the semiconductor strain gauge with an impurity concentration of 1.0 time.

By contrast, the semiconductor strain gauge with an impurity concentration of 1.33 times (impurity concentration higher than that of the semiconductor layer of the thin-film transistor by 30% or more) had a gauge factor of approximately 18. In other words, the semiconductor strain gauge with an impurity concentration of 1.33 times had a gauge factor significantly higher than that of the semiconductor strain gauge with an impurity concentration of 1.0 time. Consequently, it was found out that a semiconductor strain gauge with high sensitivity can be obtained by making the impurity concentration of the semiconductor strain gauge higher than that of the thin-film transistor.

What is claimed is:

1. A stretchable device comprising a first stretchable resin, a resin base member, an array layer, and a second stretchable resin stacked in the order as listed, wherein the resin base member comprises:

a plurality of bodies; and a plurality of hinges that couple the bodies, the array layer comprises:

a plurality of thin-film transistors disposed at the bodies; and a plurality of strain gauges disposed at the hinges, the strain gauges each include a semiconductor strain gauge made of semiconductor material at a part in a longitudinal direction, and an impurity concentration of the semiconductor strain gauge is higher than an impurity concentration of the thin-film transistor.

2. The stretchable device according to claim 1, wherein the impurity concentration of the semiconductor strain gauge is higher than the impurity concentration of the thin-film transistor by 30% or more.

3. The stretchable device according to claim 1, wherein the length of the semiconductor strain gauge is 10% to 20% of the length of the strain gauge.

4. The stretchable device according to claim 1, wherein the hinges each have a deformation reduction region where an amount of deformation when a load is acting is 1% or smaller with reference to a case where no load is acting, and the semiconductor strain gauge is disposed in the deformation reduction region.

5. The stretchable device according to claim 3, wherein the hinges each have a deformation reduction region where an amount of deformation when a load is acting is 1% or smaller with reference to a case where no load is acting, and the semiconductor strain gauge is disposed in the deformation reduction region.

6. The stretchable device according to claim 1, wherein the strain gauges each comprise:

a first strain gauge extending from a first end of the hinge in the longitudinal direction to a second end;

a second strain gauge extending from the second end of the hinge in the longitudinal direction to the first end; and a folded part disposed at the second end of the hinge in the longitudinal direction and coupling the first strain gauge and the second strain gauge.

7. The stretchable device according to claim 3, wherein the strain gauges each comprise:

a first strain gauge extending from a first end of the hinge in the longitudinal direction to a second end;

a second strain gauge extending from the second end of the hinge in the longitudinal direction to the first end; and a folded part disposed at the second end of the hinge in the longitudinal direction and coupling the first strain gauge and the second strain gauge.

8. The stretchable device according to claim 4, wherein the strain gauges each comprise:

a first strain gauge extending from a first end of the hinge in the longitudinal direction to a second end;

a second strain gauge extending from the second end of the hinge in the longitudinal direction to the first end; and a folded part disposed at the second end of the hinge in the longitudinal direction and coupling the first strain gauge and the second strain gauge.

9. The stretchable device according to claim 5, wherein the strain gauges each comprise:

a first strain gauge extending from a first end of the hinge in the longitudinal direction to a second end;

a second strain gauge extending from the second end of the hinge in the longitudinal direction to the first end; and a folded part disposed at the second end of the hinge in the longitudinal direction and coupling the first strain gauge and the second strain gauge.

10. The stretchable device according to claim 2, wherein the length of the semiconductor strain gauge is 10% to 20% of the length of the strain gauge.

11. The stretchable device according to claim 10, wherein the hinges each have a deformation reduction region where an amount of deformation when a load is acting is 1% or smaller with reference to a case where no load is acting, and the semiconductor strain gauge is disposed in the deformation reduction region.

12. The stretchable device according to claim 11, wherein the strain gauges each comprise:

a first strain gauge extending from a first end of the hinge in the longitudinal direction to a second end;

a second strain gauge extending from the second end of the hinge in the longitudinal direction to the first end; and a folded part disposed at the second end of the hinge in the longitudinal direction and coupling the first strain gauge and the second strain gauge.

13. The stretchable device according to claim 10, wherein the strain gauges each comprise:

a first strain gauge extending from a first end of the hinge in the longitudinal direction to a second end;

a second strain gauge extending from the second end of the hinge in the longitudinal direction to the first end; and a folded part disposed at the second end of the hinge in the longitudinal direction and coupling the first strain gauge and the second strain gauge.

14. The stretchable device according to claim 2, wherein the hinges each have a deformation reduction region where an amount of deformation when a load is acting is 1% or smaller with reference to a case where no load is acting, and the semiconductor strain gauge is disposed in the deformation reduction region.

15. The stretchable device according to claim 14, wherein the strain gauges each comprise:

a first strain gauge extending from a first end of the hinge in the longitudinal direction to a second end;

a second strain gauge extending from the second end of the hinge in the longitudinal direction to the first end; and a folded part disposed at the second end of the hinge in the longitudinal direction and coupling the first strain gauge and the second strain gauge.

* * * * *